(12) United States Patent
Ye et al.

(10) Patent No.: US 12,345,766 B2
(45) Date of Patent: Jul. 1, 2025

(54) BATTERY CAPACITY METER AND LITHIUM BATTERY

(71) Applicant: HUIZHOU ROYPOW TECHNOLOGY CO., LTD, Huizhou (CN)

(72) Inventors: Fuqun Ye, Huizhou (CN); Guoai Huang, Huizhou (CN); Quanfu Zou, Huizhou (CN)

(73) Assignee: HUIZHOU ROYPOW TECHNOLOGY CO., LTD, Huizhou (CN)

( * ) Notice: Subject to any disclaimer, the term of this patent is extended or adjusted under 35 U.S.C. 154(b) by 115 days.

(21) Appl. No.: 18/321,978

(22) Filed: May 23, 2023

(65) Prior Publication Data
US 2024/0183905 A1     Jun. 6, 2024

(30) Foreign Application Priority Data

Dec. 6, 2022 (CN) .......................... 202223285335.1

(51) Int. Cl.
| | |
|---|---|
| *G01R 31/36* | (2020.01) |
| *G01R 1/04* | (2006.01) |
| *H01M 10/42* | (2006.01) |
| *G01R 19/165* | (2006.01) |
| *H01M 10/0525* | (2010.01) |

(52) U.S. Cl.
CPC .......... *G01R 31/3646* (2019.01); *G01R 1/04* (2013.01); *H01M 10/425* (2013.01); *G01R 19/16542* (2013.01); *H01M 10/0525* (2013.01)

(58) Field of Classification Search
None
See application file for complete search history.

(56) References Cited

U.S. PATENT DOCUMENTS

| | | | | |
|---|---|---|---|---|
| 5,798,702 | A | * | 8/1998 | Okamoto ................. B62M 6/45 340/432 |
| 2005/0026463 | A1 | * | 2/2005 | Harris ................ H01R 12/7088 439/65 |
| 2010/0297478 | A1 | * | 11/2010 | Mashiko ............... H01M 10/12 429/7 |
| 2011/0187324 | A1 | * | 8/2011 | Tan ....................... H02J 7/0045 320/137 |
| 2014/0154535 | A1 | * | 6/2014 | Olsson ............... H01M 10/613 429/53 |
| 2018/0083393 | A1 | * | 3/2018 | Kobayashi ............... H01H 9/54 |

* cited by examiner

*Primary Examiner* — Jas A Sanghera

(57) ABSTRACT

The disclosure relates to a battery capacity meter and a lithium battery. The battery capacity meter includes: a meter housing having a mounting cavity formed inside the meter housing; and a circuit board assembly mounted in the mounting cavity, the circuit board assembly including a first circuit board, a second circuit board, a display component and a controller, the first circuit board and the second circuit board being stacked and electrically connected to each other, the display component being mounted on the first circuit board, and the controller being mounted on the second circuit board and electrically connected to the display component.

13 Claims, 1 Drawing Sheet

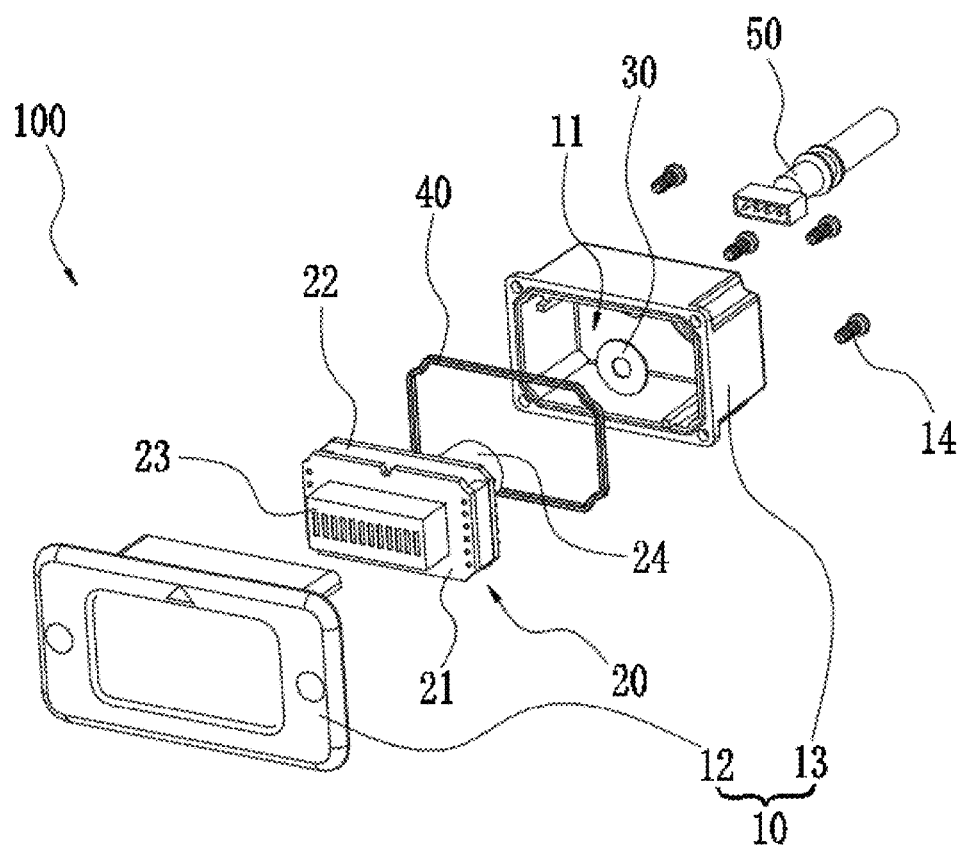

BATTERY CAPACITY METER AND LITHIUM BATTERY

CROSS-REFERENCE TO RELATED APPLICATIONS

This application claims priority to Chinese patent application No. 202223285335.1 filed with the Chinese Patent Office on Dec. 6, 2022, entitled "BATTERY CAPACITY METER AND LITHIUM BATTERY", the entire content of which is incorporated by reference.

TECHNICAL FIELD

The present disclosure relates to the field of battery manufacturing technology, and particularly to a battery capacity meter and a lithium battery.

BACKGROUND

With the rapid development of the new energy vehicle industry in recent years, the lithium battery as the main power source of new energy vehicles, has a market demand shown explosive growth. The lithium battery is generally equipped with a battery capacity meter to measure the amount of power output from the lithium battery. However, the design of the existing battery capacity meter is not reasonable, which has a large number of parts, a complex structure, a low degree of integration, and a lower maintainability in the later period.

SUMMARY

In view of this, it is necessary to provide a battery capacity meter and a lithium battery, to address the problems of large number of parts, complex structure, low degree of integration, and lower maintainability in the later period existing in the prior art.

In one aspect, the present disclosure provides a battery capacity meter, including:
  a meter housing having a mounting cavity formed inside the meter housing; and
  a circuit board assembly mounted in the mounting cavity, the circuit board assembly including a first circuit board, a second circuit board, a display component and a controller, the first circuit board and the second circuit board being stacked and electrically connected to each other, the display component being mounted on the first circuit board, and the controller being mounted on the second circuit board and electrically connected to the display component.

The battery capacity meter in the above solution is applied and assembled in the lithium battery, and the circuit board assembly is mounted in the mounting cavity of the meter housing. Since the circuit board assembly adopts an integrated structure design in which the first circuit board and the second circuit board are stacked, and the display component and the controller are mounted and integrated on the first circuit board and the second circuit board respectively, it allows a higher integration of the circuit board assembly, thereby greatly reducing the number of components of the battery capacity meter, and thus simplifying the structure of the battery capacity meter, accordingly the later maintainability is improved.

The technical solution of the present disclosure will be further detailed below.

In an embodiment, one of the first circuit board and the second circuit board is provided with a pin, the other of the first circuit board and the second circuit board is provided with a socket, and the pin is fitted and inserted into the socket.

In an embodiment, the battery capacity meter further includes a buzzer mounted on the second circuit board and electrically connected to the controller.

In an embodiment, the battery capacity meter further includes a waterproof sound-transmitting film mounted on the buzzer.

In an embodiment, the meter housing includes a front housing provided with a transparent portion opposite to the display component.

In an embodiment, the meter housing further includes a rear housing and a fastener, the rear housing is assembled and fixed to the front housing by the fastener. At least one of a side of the front housing facing the rear housing and a side of the rear housing facing the front housing is provided with a groove, to allow the front housing and the rear housing to enclose to form the mounting cavity. The front housing and the rear housing are integrated by plastic molding.

In an embodiment, the fastener is a screw bolt, the rear housing is provided with a through hole, and the front housing is provided with a threaded hole aligned with the through hole through which the screw bolt is screwed and fixed in the threaded hole.

In an embodiment, the meter housing further includes a sealing ring mounted between mating surfaces of the front housing and the rear housing.

In an embodiment, the battery capacity meter further includes a connection wire harness. The rear housing is provided with an insertion hole opposite to the controller, and the connection wire harness passes through the insertion hole to electrically connect to the controller.

In another aspect, the present disclosure further provides a lithium battery, including the battery capacity meter according to the above aspect.

BRIEF DESCRIPTION OF THE DRAWINGS

The accompanying drawings forming part of the present disclosure are utilized to provide further understanding of the disclosure, and the exemplary embodiments of the present disclosure and the descriptions are utilized to explain the disclosure, which shall not constitute improper limitation to the present disclosure.

In order to more clearly describe the technical solution in the embodiments of the present disclosure, the accompanying drawings required in the description of the embodiments will be briefly introduced. Obviously, the drawings in the following description are merely some embodiments of the present disclosure. Those of ordinary skill in the art can also obtain other drawings based on these drawings without creative work.

FIG. 1 is a schematic exploded view of a battery capacity meter according to an embodiment of the present disclosure.

REFERENCE SIGNS 100, battery capacity meter; 10, meter housing; 11, mounting cavity; 12, front housing; 13, rear housing; 14, fastener; 20, circuit board assembly; 21, first circuit board; 22, second circuit board; 23, display component;

24, buzzer; 30, waterproof sound-transmitting film; 40, sealing ring; 50, connection wire harness.

DETAILED DESCRIPTION

In order to facilitate understanding of the present disclosure, the embodiments of the present disclosure will be detailed with reference to the accompanying drawings. Many specific details are stated in the following description in order to fully understand the disclosure. However, the present disclosure can be implemented in many other ways that are different from those described herein, and those skilled in the art can make similar improvements without departing from the concept of the disclosure. Therefore, the present disclosure is not limited by the specific embodiments provided below.

As shown in FIG. 1, a battery capacity meter 100 according to an embodiment of the present disclosure includes a meter housing 10 and a circuit board assembly 20. An interior of the meter housing 10 is formed with a mounting cavity 11. The circuit board assembly 20 is mounted in the mounting cavity 11. The circuit board assembly 20 includes a first circuit board 21, a second circuit board 22, a display component 23, and a controller. The first circuit board 21 and the second circuit board 22 are stacked and electrically connected to each other. The display component 23 is mounted on the first circuit board 21. The controller is mounted on the second circuit board 22 and electrically connected to the display component 23.

It should be appreciated that the display component 23 is configured to display an electricity value. For example, the display component 23 may be an LCD screen or the like. The controller can be but is not limited to a micro-control chip, PLC, etc., which can not only interact with an external device for information, but also output instructions to the display component 23 to adjust a displayed value.

The advantages obtained by implementing the technical solution of the embodiment are provided as follows. The battery capacity meter 100 in the above solution is applied and assembled in a lithium battery, and the circuit board assembly 20 is mounted in the mounting cavity 11 of the meter housing 10. Since the circuit board assembly 20 adopts an integrated structure design in which the first circuit board 21 and the second circuit board 22 are stacked, and the display component 23 and the controller are mounted and integrated on the first circuit board 21 and the second circuit board 22 respectively, it allows a higher integration of the circuit board assembly 20, thereby greatly reducing the number of components of the battery capacity meter 100, and thus simplifying the structure of the battery capacity meter 100, accordingly the later maintainability is improved.

In order to avoid the interference between the first circuit board 21 and the second circuit board 22 which are stacked during the mounting, the display component 23 is mounted on a side of the first circuit board 21 away from the second circuit board 22, and the controller is mounted on a side of the second circuit board 22 away from the first circuit board 21.

The mounting modes of the display component 23 and controller can be but not limited to any of welding, plug-in, magnetic suction connection, etc., which can be flexibly selected according to actual requirements.

In some embodiments, one of the first circuit board 21 and the second circuit board 22 is provided with a pin, the other of the first circuit board 21 and the second circuit board 22 is provided with a socket. The pin is fitted and inserted into the socket. Accordingly, the first circuit board 21 can be electrically connected to the second circuit board 22 to perform the information interaction, and the plug-in mounting mode formed by the pin and the socket is simple, with a stable and reliable.

Further, one of the first circuit board 21 and the second circuit board 22 is further provided with a clamping element, and the other is further provided with a buckling element. The clamping element is synchronously engaged with the buckling element while the pin is inserted into the socket, thereby helping to improve the connection strength between the first circuit board 21 and the second circuit board 22. In addition, the clamping-buckling connection structure is further able to withstand the vibration shock during the loading, transportation or installation of the battery capacity meter 100, to avoid the deforming or even breaking of the pin and the socket.

Referring to FIG. 1, in another embodiment, the battery capacity meter 100 further includes a buzzer 24 mounted on the second circuit board 22 and electrically connected to the controller. When the lithium battery is in an abnormal working condition, the controller can control the buzzer 24 to give a buzzer prompt to warn the staff that the lithium battery is faulty, so that the staff can intervene to eliminate the faults and potential safety hazards timely.

Further, the battery capacity meter 100 includes a waterproof sound-transmitting film 30 which is mounted on the buzzer 24. When the battery capacity meter 100 is mounted in an outdoor service environment, and if the rainwater penetrates into the batter capacity meter 100 on a rainy day, the waterproof sound-transmitting film 30 can prevent the rainwater from entering the 190 buzzer 24 to avoid the damage to the buzzer 24.

Referring to FIG. 1, on the basis of any of the above embodiments, the meter housing 10 includes a front housing 12, a rear housing 13, and a fastener 14. The front housing 12 is provided with a transparent portion, and the transparent portion is disposed opposite to the display component 23, which facilitates a direct observation of the reading of the display component 23 from the outside.

The rear housing 13 is assembled and fixed to the front housing 12 by the fastener 14, and at least one of a side of the front housing 12 facing the rear housing 13 and a side of the rear housing 13 facing the front housing 12 is provided with a groove, so that the front housing 12 and the rear housing 13 can enclose to form a mounting cavity 11. The mounting cavity 11 is thus formed in a simple manner. Specifically, in the embodiment, the meter housing 10 is formed into a square box structure.

In an embodiment, the front housing 12 and the rear housing 13 are integrated by plastic molding. Compared to the existing structure mode in which the front housing 12 and the rear housing 13 are assembled through screwing by means of a plurality of components, in the present disclosure, the front housing 12 and the rear housing 13 are integrated by plastic molding, which has better integrity and sealing reliability.

In some embodiments, the fastener 14 is a screw bolt, the rear housing 13 is provided with a through hole, and the front housing 12 is provided with a threaded hole aligned with the through hole through which the screw bolt is screwed and fixed in the threaded hole. The threaded connection is simple in the structure, and easy in the assembly and disassembly operations, and allows the front housing 12 and the rear housing 13 to connect firmly and reliably. In some embodiment, the screw bolt, through hole and the threaded hole are all set to two or more and are assembled in a one-to-one correspondence, thereby further improving the connection strength between the front housing 12 and the rear housing 13.

Further, the meter housing 10 further includes a sealing ring 40 which is mounted between mating surfaces of the front housing 12 and the rear housing 13. The sealing ring 40 is compressed and deformed to effectively seal the assembling surface, thereby preventing the rainwater and dust in the external environment from entering the housing, and improving the sealing protection performance of the battery capacity meter 100, accordingly the protection level of the battery capacity meter 100 can reach IP67, and the failure rate and other adverse problems are greatly reduced. For example, the sealing ring 40 is a rubber ring.

With reference to FIG. 1, in another embodiment, the battery capacity meter further includes a connection wire harness 50. The rear housing 13 is provided with an insertion hole opposite to the controller, and the connection wire harness 50 passes through the insertion hole to electrically connect to the controller. After mounted, the connection wire harness 50 facilitates the connection of the battery capacity meter 100 to the external electrical equipment. In some embodiment, the connection wire harness 50 is a waterproof wire harness, which has an excellent waterproof performance, and is beneficial to improve the reliability and service life thereof.

In addition to the above, the present disclosure further provides a lithium battery including the battery capacity meter 100 as described in any of the above embodiments.

The technical features of the above-described embodiments can be arbitrarily combined; and in order to make the description concise, all possible combinations of the technical features in the above-described embodiments are not described. However, as long as there is no contradiction in the combinations of these technical features, these combinations should be considered as the scope of the present disclosure.

The embodiments described above are merely some embodiments of the present disclosure, and the descriptions are more specific and detailed, but are not thereby understood as limiting the scope of the disclosure. It should be pointed out that those skilled in the art can make several deformations and improvements without departing from the concept of the present disclosure, which all should fall within the protection scope of the present disclosure. Therefore, the protection scope of the disclosure shall be subject to the attached claims.

In the description of the present disclosure, it should be appreciated that azimuths or positional relationships indicated by the terms "center", "longitudinal", "transverse", "length," "width", "thickness", "upper", "lower", "front", "rear", "left", "right", "vertical", "horizontal", "top", "bottom", "inner", "outer", "clockwise", "anti-clockwise", "axial", "radial", "circumferential" and the like are the azimuths or positional relationships shown based on the drawings, and merely for the convenience of describing the disclosure and simplifying the description, and are not indicative or implied that the device or element definitely has a specific azimuth, or is constructed and operated with a specific azimuth, and therefore cannot be understood as a limitation to the present disclosure.

In addition, the terms "first" and "second" are merely used for the descriptive purposes and cannot be understood as indicating or implying a relative importance or an implied indication of the number of technical features indicated. Thus, a feature defined with "first" or "second" may expressly or implicitly include at least one such feature. In the description of the present disclosure, "multiple" means at least two, such as two, three, etc., unless otherwise specifically defined.

In the present disclosure, unless otherwise clearly specified and defined, the terms "installation", "coupling", "connection", "fixed" and other terms shall be broadly understood, for example, may be a fixed connection, or a detachable connection, or may be integrated, or a mechanical connection, or an electrical connection, or a direct connection, or an indirect connection through an intermediate medium, or a connection within two elements or an interaction between two elements, unless otherwise expressly defined. Those skilled in the art can understand the specific meanings of the above terms in the present disclosure according to specific circumstances.

In the present disclosure, the first feature may be in direct contact with the second feature, or in indirect contact with the second feature through an intermediate medium, unless otherwise expressly provided and defined. Further, the first feature is "above", "on" and "on top of" the second feature, which may mean that the first feature is directly above or obliquely above the second feature, or may simply indicate that the first feature is at a higher level than the second feature. The first feature is "below", "under" or "beneath" the second feature, which may mean that the first feature is directly below or obliquely below the second feature, or may simply indicate that the first feature is at a lower level than the second feature.

It should be noted that when an element is referred to as being "fixed" or "provided" on another element, the element may be directly on the other element or there may be an intermediate element. When an element is referred to as being "connected" to another element, it may be directly connected to the another element or there may simultaneously exist an intermediate element. The terms "vertical", "horizontal", "up", "down", "left", "right" and similar expressions used herein are merely for illustrative purposes and are not meant to be exclusive.

What is claimed is:

1. A battery capacity meter, comprising:
   a meter housing having a mounting cavity formed inside the meter housing; and
   a circuit board assembly mounted in the mounting cavity, the circuit board assembly comprising a first circuit board, a second circuit board, a display component and a controller, the first circuit board and the second circuit board being stacked and electrically connected to each other, the display component being mounted on the first circuit board, and the controller being mounted on the second circuit board and electrically connected to the display component
   wherein the display component is mounted on a side of the first circuit board away from the second circuit board, and the controller is mounted on a side of the second circuit board away from the first circuit board.

2. The battery capacity meter according to claim 1, wherein one of the first circuit board and the second circuit board is provided with a pin, the other of the first circuit board and the second circuit board is provided with a socket, and the pin is fitted and inserted into the socket.

3. The battery capacity meter according to claim 1, further comprising a buzzer mounted on the second circuit board and electrically connected to the controller.

4. The battery capacity meter according to claim 3, further comprising a waterproof sound-transmitting film mounted on the buzzer.

5. The battery capacity meter according to claim 1, wherein the meter housing comprises a front housing provided with a transparent portion opposite to the display component.

6. The battery capacity meter according to claim 5, wherein the meter housing further comprises a rear housing and a fastener, the rear housing is assembled and fixed to the front housing by the fastener, and at least one of a side of the front housing facing the rear housing and a side of the rear housing facing the front housing is provided with a groove, to allow the front housing and the rear housing to enclose to form the mounting cavity.

7. The battery capacity meter according to claim 6, wherein the fastener is a screw bolt, the rear housing is provided with a through hole, and the front housing is provided with a threaded hole aligned with the through hole through which the screw bolt is screwed and fixed in the threaded hole.

8. The battery capacity meter according to claim 6, wherein the meter housing further comprises a sealing ring mounted between mating surfaces of the front housing and the rear housing.

9. The battery capacity meter according to claim 6, further comprising a connection wire harness, wherein the rear housing is provided with an insertion hole opposite to the controller, and the connection wire harness passes through the insertion hole to electrically connect to the controller.

10. The battery capacity meter according to claim 5, wherein the meter housing further comprises a rear housing, the front housing and the rear housing are integrated by plastic molding, and at least one of a side of the front housing facing the rear housing and a side of the rear housing facing the front housing is provided with a groove, to allow the front housing and the rear housing to enclose to form the mounting cavity.

11. The battery capacity meter according to claim 10, wherein the meter housing further comprises a sealing ring mounted between mating surfaces of the front housing and the rear housing.

12. The battery capacity meter according to claim 10, further comprising a connection wire harness, wherein the rear housing is provided with an insertion hole opposite to the controller, and the connection wire harness passes through the insertion hole to electrically connect to the controller.

13. A lithium battery, comprising the battery capacity meter of claim 1.

* * * * *